(12) United States Patent
Meng et al.

(10) Patent No.: US 10,182,501 B2
(45) Date of Patent: Jan. 15, 2019

(54) METHOD FOR PREPARING ADHESIVE-FREE POLYIMIDE FLEXIBLE PRINTED CIRCUIT BOARD

(71) Applicant: SUZHOU WEIPENG ELECTRICAL TECHNOLOGY CO., LTD, Suzhou (CN)

(72) Inventors: Yuedong Meng, Suzhou (CN); Peng Chang, Suzhou (CN); Gangqiang Cai, Suzhou (CN)

(73) Assignee: SUZHOU WEIPENG ELECTRICAL TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 15/558,189

(22) PCT Filed: Jul. 14, 2016

(86) PCT No.: PCT/CN2016/090073
§ 371 (c)(1),
(2) Date: Sep. 13, 2017

(87) PCT Pub. No.: WO2017/016395
PCT Pub. Date: Feb. 2, 2017

(65) Prior Publication Data
US 2018/0070454 A1    Mar. 8, 2018

(30) Foreign Application Priority Data
Jul. 29, 2015    (CN) .......................... 2015 1 0454505

(51) Int. Cl.
| | |
|---|---|
| *H05K 3/18* | (2006.01) |
| *H05K 3/38* | (2006.01) |
| *C23C 14/20* | (2006.01) |
| *C25D 3/38* | (2006.01) |
| *C23C 18/16* | (2006.01) |
| *H05K 3/02* | (2006.01) |
| *H05K 1/02* | (2006.01) |
| *H05K 1/09* | (2006.01) |

(52) U.S. Cl.
CPC ........... *H05K 3/188* (2013.01); *C23C 14/205* (2013.01); *C23C 18/1633* (2013.01); *C25D 3/38* (2013.01); *H05K 3/02* (2013.01); *H05K 3/381* (2013.01); *H05K 1/028* (2013.01); *H05K 1/09* (2013.01); *H05K 2201/0154* (2013.01); *H05K 2203/095* (2013.01)

(58) Field of Classification Search
None
See application file for complete search history.

(56) References Cited

U.S. PATENT DOCUMENTS

| | | | |
|---|---|---|---|
| 2003/0148078 A1 | 8/2003 | Aida | |
| 2008/0286585 A1* | 11/2008 | Lem | C08L 79/08 428/458 |
| 2015/0329971 A1* | 11/2015 | Lee | H05K 3/381 427/535 |
| 2018/0070454 A1* | 3/2018 | Meng | H05K 3/02 |
| 2018/0124923 A1* | 5/2018 | Meng | H05K 3/188 |

FOREIGN PATENT DOCUMENTS

| | | |
|---|---|---|
| CN | 1189125 A | 7/1998 |
| CN | 1272072 A | 11/2000 |
| CN | 101313010 A | 11/2008 |
| CN | 101684554 A | 3/2010 |
| CN | 104228209 A | 12/2014 |
| JP | 04282844 A | 10/1992 |
| WO | WO2014092335 A1 | 6/2014 |

* cited by examiner

*Primary Examiner* — Allan Olsen
(74) *Attorney, Agent, or Firm* — Gokalp Bayramoglu

(57) ABSTRACT

A method for preparing an adhesive-free polyimide flexible printed circuit board is provided. The method includes the following steps: 1) placing a polyimide thin film into a low vacuum environment, and treating the polyimide thin film using plasma produced by capacitively coupled discharge of an organic amine; 2) placing the polyimide thin film obtained in step 1) into a low vacuum environment, and pretreating the polyimide thin film using plasma formed by capacitively coupled discharge of a nitrogen gas bubbled through a metal salt solution; 3) pre-plating the polyimide thin film obtained in step 2) using vacuum sputtering or chemical plating so as to obtain a dense copper film with a thickness of less than 100 nm; and 4) thickening the copper film to a required thickness by means of an electroplating method.

20 Claims, 1 Drawing Sheet

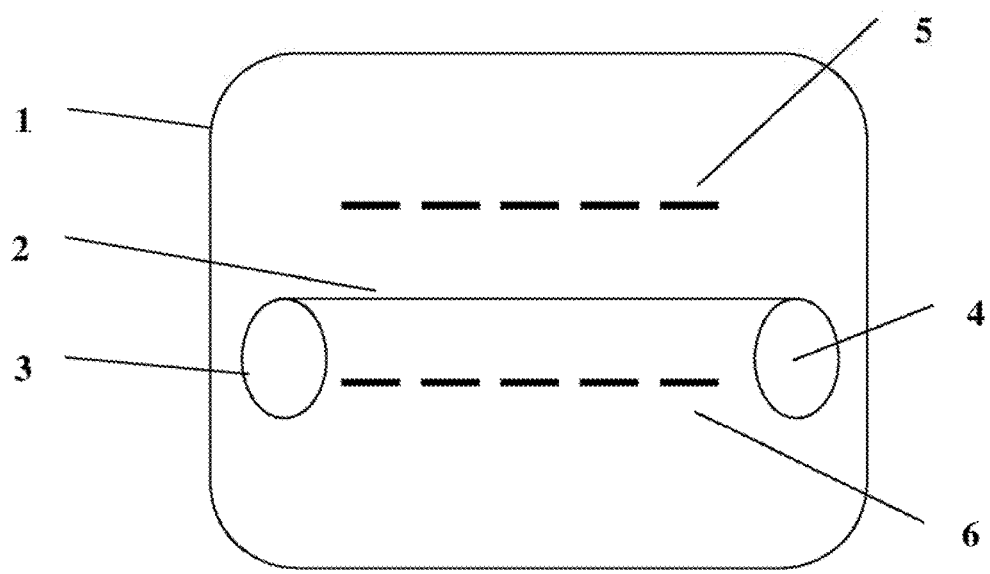

METHOD FOR PREPARING ADHESIVE-FREE POLYIMIDE FLEXIBLE PRINTED CIRCUIT BOARD

CROSS REFERENCE TO RELATED APPLICATIONS

This application is the national phase of International Application No. PCT/CN2016/090073, filed on Jul. 14, 2016, which is based upon and claims priority to Chinese Patent Application No. 201510454505X, filed on Jul. 29, 2015, the entire contents of which are incorporated herein by reference.

TECHNICAL FIELD

The present invention relates to the field of technology for preparing microelectronic circuit board, particularly relates to a surface processing method of polyimide and a method for preparing circuit substrate.

BACKGROUND

Ultrathin adhesive-free flexible printed circuit is the developing trend of the microelectronic industry. According to the binding manner of the substrate and the copper foil of the flexible circuit board, the flexible circuit boards can be categorized into the flexible circuit board with adhesive and adhesive-free flexible circuit board. According to the structure, the flexible circuit board can be categorized into the single-sided flexible circuit board, double-sided flexible board, multi-layered soft board, rigid-flex board, etc. Though the price of the adhesive-free flexible circuit board is remarkably higher than that of the flexible board with adhesive, parameters of the adhesive-free flexible circuit board, including the flexibility, the binding force of copper foil and substrate, the flatness of pad, etc. are much higher than those of flexible board good with adhesive. Lower the thickness of the copper foil, the better will be the folding resistance, which is beneficial for the bare chip to be attached to the flexible board (COF).

Currently, there are three methods for manufacturing the substrate of adhesive-free flexible printed circuit (FPCB):

1. Sputtering/Plating method: This method uses a polyimide (PI) film as the substrate. After a layer of metal is plated on the PI film using vacuum sputtering plating, electroplating is further conducted to increases the thickness of the copper layer. The advantage of this method is that an ultrathin two-layer soft board can be produced. The thickness of the copper film can be as low as 3-12 µm. Moreover, a soft board having two sides of different thicknesses can be produced.

2. Casting method: This method uses a copper foil as the substrate. The synthesized polyimide resin is extruded and coated on the copper foil which is in the shape of a roll by a die head. After being dried by an oven and imidization, a two-layer soft board is formed. This method is usually used for the single-sided soft board, but is difficult to be used for manufacturing double-sided soft board substrate.

3. Lamination method: This method uses a non-thermoplastic PI thin film as a core layer base film and uses a thermoplastic PI thin film as a surface layer base film. Next, a copper foil is coated. After a short time of hot rolling, a two-layer soft board is formed by imidization and high-temperature lamination processing.

In the above methods, both the casting method and the lamination method need the copper foil as the substrate. However, it is difficult to make the thickness of copper foil less than 5 µm. The requirement for an ultrathin FPC in the developing trend of the microelectronic industry is hard to meet.

Ultrathin FPC can be obtained by sputtering/electroplating method. However, due to a low surface roughness of the polyimide thin film and chemical inertness, the copper film formed by sputtering deposition usually has a low peel strength. Moreover, the technical threshold of this method is high and this method is still in a research stage.

In the year of 2014, science and technology daily and major websites reported and reproduced that the team of Professor Yang Zhenguo in the Department of Material Science of Fudan University newly developed a novel process for manufacturing double-sided flexible printed circuit board, which is "print-absorb-catalyst addition" process. The core of this new process is that dedicated ionic absorbing ink is developed autonomously. As a connecting layer between the resin-based board and the conductive plated copper, such ionic absorbing ink can catalyze the chemical plating reaction. Special groups in the ionic absorbing ink, amido, carboxyl, hydroxy etc. can significantly improve the interfacial adhesive force between the circuit board substrate and the plated layer. This method can provide a new approach for green, low-cost, massive production, roll-to-roll manufacturing of the flexible printed circuit. However, such method in which the ionic absorbing ink is used as the connecting layer between the resin-based board and conductive plated copper only replaces the glue (adhesive) in the process of flexible circuit board with adhesive. Essentially, the flexible circuit board with adhesive is still needed.

Patent document CN 101684554A discloses a chemical copper plating liquid of a polyimide thin film and a chemical copper plating method thereof. However, the exemplary result in this patent did not test the most critical parameter—the peel strength of the copper film and polyimide thin film. Actually, if the polyimide thin film is only cleaned and processed, no matter whether the vacuum sputtering plating or the chemical plating is applied, the peel strengths of the metal film and polyimide thin film cannot reach the standard.

Based on the above technical background analysis, it is confirmed that technical difficulty for preparing an ultrathin polyimide (PI) adhesive-free flexible printed circuit substrate is the peel strength problems of polyimide thin film and the copper film (sputtering method or chemical plating). However, this technical difficulty has not been well solved all the way.

SUMMARY

Regarding the technical difficulty, the present invention provides a method for preparing an ultrathin polyimide (PI) adhesive-free flexible printed circuit (FPCB, also referred as soft board) substrate. This method conducts plasma surface modification on the polyimide thin film. Next, the vacuum sputtering plating or the chemical plating (also referred as copper deposition) is conducted. A dense copper film with the thickness of less than 100 nm is plated. Finally, plating is conducted to thicken the copper film to a desired copper film thickness. The ultrathin adhesive-free flexible printed circuit board substrate with a high peel strength is thus manufactured.

The present invention provides a method of surface processing polyimide, and includes the following steps:

1) Polyimide thin film is placed in a low vacuum environment. The treatment is conducted on the polyimide thin film using plasma generated by a capacitively coupled discharge of an organic amine. The treatment is conducted on the polyimide thin film.

2) The polyimide thin film obtained in Step 1) is placed into a low vacuum environment. The pretreatment is conducted on the polyimide thin film using plasma formed by a capacitively coupled discharge of nitrogen gas bubbled through a metal salt solution.

3) The polyimide thin film obtained in Step 2) is pre-plated using the vacuum sputtering plating or the chemical plating, so as to obtain a dense copper film with the thickness of less than 100 nm.

4) The copper film is thickened to a desired thickness by an electroplating method.

Preferably, the power density of the low vacuum capacitively coupled discharge is (the output power of the power supply/(the electrode area×the space between two electrodes))>0.1 W/cm$^3$. The electric field intensity of the discharge region (the discharge voltage/the space between electrodes) is >5.0 kV/m, and the pressure range of the capacitively coupled discharge is 30 Pa-80 Pa, such that the etching and grafting effects are ensured.

The treatment of the surface of polyimide using the plasma generated by the organic amine gas coupled discharge can achieve amino grafting on the surface, surface etching, and roughening.

Preferably, the organic amine is fatty amine. More preferably, the organic amine is methylamine, ethylamine, propylamine, butyl amine, amylamine, or hexylamine. The isomers of the above amines can also apply to the present invention.

Preferably, the plasma treatment time in step 1) is 5-10 seconds. The surface of polyimide is treated using plasma formed by the capacitively coupled discharge of a nitrogen gas bubbled through a metal salt solution. The surface of the polyimide thin film can be further grafted with active groups like hydroxy, sulfoacid, etc., and can be deposited with metal elements. The gas is nitrogen gas. The reason for selecting nitrogen gas is to consume the hydrogen bond donor of polyimide, so as to reduce the hydrogen gas generated during the chemical plating, and improve the binding force of the plated film.

Preferably, the plasma treatment time in Step 2) is 10-30 seconds.

Preferably, the pressure of the background vacuum environment in Step 1) and Step 2) is no more than 20 Pa.

Preferably, the metal salt is copper salt, palladium salt, or nickel salt. The metal salt is soluble in water. The metal salt can be nitrate, sulfate, and chloride. As to the concentration of the solution, which can be the saturated solution or diluted solution of the corresponding metal salt, the higher the concentration, the better. During the treatment, the metal salt forms crystal nuclei on the surface of polyimide, and these crystal nuclei are similar to that of crystallization stage in the following treatment. Thus, a person of ordinary skill in the art can select a proper concentration as needed.

Preferably, the metal salt solution is the solution prepared with corresponding metal salt and deionized water.

In one embodiment of the present invention, in Step 2), nitrogen gas bubbled through copper sulfate solution (mass ratio of copper sulfate:deionized water≥1:2) is injected. The plasma discharge treatment is conducted for 10-30 seconds. Active groups like copper element, hydroxy, and sulfoacid originate from the copper sulfate solution.

In one embodiment of the present invention, in step 2), nitrogen gas bubbled through palladium solution diluted by deionized water (palladium solution:deionized water≥1:7) is injected. The plasma discharge treatment is conducted for 10-30 seconds. Here, the palladium solution is a palladium sulfate solution with a palladium concentration of 4000 mg/L.

In one embodiment of the present invention, in step 2) nitrogen gas bubbled through nickel chloride solution diluted by deionized water (nickel chloride:deionized water 1:5) is injected. The plasma discharge treatment is conducted for 10-30 seconds.

Preferably, the copper film with the thickness of 50-100 nm is pre-plated on the surface of polyimide through vacuum sputtering plating or chemical plating.

More preferably, when the copper film is plated through chemical plating, a pH value of the solution is less than 6, preferably 5-6.

The method of the present invention not only eliminates the adhesive (adhesive-free), but also can simplify the process, lower the labor investment, reduce the cost, and cut down environmental pollution. The method can be used for manufacturing the ultrathin adhesive-free flexible printed circuit board.

BRIEF DESCRIPTION OF THE DRAWINGS

FIG. 1 is a schematic diagram of the method for preparing and manufacturing an ultrathin adhesive-free flexible printed circuit board of the present invention.

Reference numbers in the drawings: 1. plasma cavity; 2. polyimide thin film; 3. unwinding roll; 4. winding roll; 5. positive electrode; 6. negative electrode.

DETAILED DESCRIPTION

Embodiments of the present invention are provided as below, and these embodiments are merely used to illustrate the present invention rather than limiting the present invention.

FIG. 1 is a schematic diagram of the method of preparing an ultrathin adhesive-free flexible printed circuit board of the present invention. In FIG. 1, a polyimide thin film is inside a plasma cavity. A winding roll device includes winding roll 4 and unwinding roll 3. The rotation speed of the winding roll machine controls the discharge treatment time of polyimide thin film 2.

Embodiment 1

(1) A polyimide thin film roll (one of three thicknesses 12.5 μm, 25 μm, and 50 μm) produced by Wanda Group of China is mounted in the winding roll device in the cavity of the low vacuum plasma generator, which is vacuumized to less than 20 Pa. Methylamine gas is fed to discharge, so as to generate plasma, by which etching and amino-grafting can be conducted on the polyimide thin film. The rotation speed of the winding roll machine is controlled, such that the duration for the polyimide thin film to pass through the plasma discharge region is 5-10 seconds. The power density of plasma discharge is (output power of power supply/(electrode area×space between two electrodes))>0.1 W/cm$^3$. The discharge voltage matches the electric field intensity of the discharge region (discharge voltage/space between electrodes), which is >5.0 kV/m. In order to improve the etching efficiency of plasma, polyimide which cannot tolerate alkaline is processed by discharging with alkaline methylamine gas. The range of the pressure of the discharging is 30 Pa-80 Pa.

(2) The methylamine supply is stopped. The suction is continued till the vacuum degree is less than 20 Pa. Nitrogen gas bubbled through copper sulfate solution (copper sulfate: deionized water≥1:2) is injected. The plasma discharge treatment is conducted for 10-30 seconds. The machine is stopped and the air is fed. The polyimide thin film roll is taken out, and placed in a sealed package. The next step of process which is sputtering plating or the chemical plating is conducted.

(3) With the commercial vacuum sputtering plating machine, the vacuum sputtering is conducted to plate the copper film on the polyimide thin film after a plasma treatment. In order to avoid damaging the polyimide thin film by the electrolyte during the next step of plating and thickening, the compactness of copper film plated by the vacuum sputtering is required to be high. Preferably, the thickness of sputtering plated copper film is 50-100 nm.

(4) An electroplating method is used to thicken the sputtering plated copper layer. By adjusting electroplating time, the thickness of plated copper film is controlled. The copper film with any thickness can be prepared.

Table 1 shows the surface roughness of PI film after plasma treatment. From the average roughness (Ra) value, compared with the original sample without plasma treatment, the surface roughness of plasma-treated PI film is increased significantly. As the treatment time increases, the surface roughness increases. When the plasma treatment time is more than 10 seconds, the average roughness increases 40%-65%. The improvement of the surface roughness of PI film is beneficial for improving the binding force of sputtering plated/chemical plated copper film. Table 2 shows the measured values of the peel strength of sputtering plated copper film after the PI films with three different thicknesses are subject to different plasma treatment time. From the measured results, the thickness of PI film does not affect the treatment effect. PI film without plasma treatment cannot be plated with the copper film. After the plasma treatment, the binding force between the plated copper film and PI is good. The peel strength is >8.0 N/cm, which is higher than the industry standard (≥7.5N/cm). When the plasma treatment time is more than 20 seconds, though the effect is good, the trend of decrease shows up. Thus, preferably, the plasma treatment time is 5-20 seconds. Table 3 shows the measured values of the peel strengths of the copper films with different thicknesses. The plasma treatment time is 10 seconds. The sputtering plating and the plating for thickening are conducted. The results show that the thickness of the copper film of the flexible board prepared by this technology does not affect the binding force.

TABLE 1

Surface roughness of the polyimide thin film (PI film) after plasma treatment.

| Plasma treatment time (s) | Plasma treatment | | | Without plasma treatment | | |
|---|---|---|---|---|---|---|
| | Ra | Rq | Rz | Ra | Rq | Rz |
| 5 | 0.391 | 0.489 | 2.031 | 0.312 | 0.363 | 1.353 |
| 8 | 0.42 | 0.498 | 1.842 | 0.318 | 0.37 | 1.321 |
| 12 | 0.426 | 0.537 | 2.039 | 0.295 | 0.344 | 1.515 |
| 14 | 0.427 | 0.534 | 2.119 | 0.257 | 0.297 | 1.147 |
| 16 | 0.447 | 0.535 | 2.101 | 0.263 | 0.329 | 1.408 |
| 18 | 0.458 | 0.599 | 2.273 | 0.305 | 0.355 | 1.604 |
| 20 | 0.465 | 0.554 | 2.075 | 0.282 | 0.348 | 1.335 |
| 30 | 0.467 | 0.553 | 1.875 | 0.271 | 0.326 | 1.175 |

TABLE 2

The peel strengths of sputtering plated copper film after the polyimide thin film (PI film) is plasma-treated for different time.

| | Plasma treatment time | | | | | | | | | Thickness of PI film (μm) |
|---|---|---|---|---|---|---|---|---|---|---|
| | 0 | 4 | 8 | 12 | 16 | 20 | 24 | 28 | 32 | 36 | |
| Peel strength (N/cm) | 0 | 8.8 | 8.4 | 8.3 | 8.2 | 8.3 | 8.5 | 8.3 | 8.4 | 8.1 | 12.5 |
| | 0 | 8.6 | 8.0 | 8.4 | 8.1 | 8.2 | 8.6 | 8.4 | 8.6 | 8.3 | 20 |
| | 0 | 8.8 | 8.6 | 8.3 | 8.2 | 8.4 | 8.5 | 8.3 | 8.3 | 8.1 | 50 |

TABLE 3

The peel strengths of copper films with different thicknesses.

| | Thickness of copper film (μm) | | | | | | | | Thickness of PI film (μm) |
|---|---|---|---|---|---|---|---|---|---|
| | 5 | 10 | 15 | 20 | 25 | 30 | 40 | 50 | |
| Peel strength (N/cm) | 8.3 | 8.8 | 8.4 | 8.6 | 8.5 | 8.5 | 8.5 | 8.3 | 12.5 |
| | 8.2 | 8.2 | 8.0 | 8.4 | 8.3 | 8.2 | 8.6 | 8.6 | 20 |
| | 8.4 | 8.7 | 8.6 | 8.3 | 8.2 | 8.4 | 8.5 | 8.4 | 50 |

Embodiment 2

Step (1) of Embodiment 2 is the same as Step (1) in Embodiment 1.

Step (2) of Embodiment 2 is the same as Step (2) in Embodiment 1.

Step (3), The chemical plating (copper deposition) is directly conducted on plasma-treated polyimide thin film. Since the polyimide thin film cannot tolerate alkali, it is stable to diluted acid. However, the pH value of the chemical plating solution of the conventional copper deposition process is 12.5-13. In order to avoid the damage caused by the chemical plating solution to the polyimide thin film, which leads to the decrease of the peel strength of the deposited copper film, the chemical plating solution with a low pH value should be prepared. For example, the pH value is about 5. In order to avoid damaging polyimide thin film by the electrolyte during the next step of plating for thickening, the compactness of the chemical plated copper film should be high. Preferably, the thickness of the chemical plated copper film is 50-100 nm.

Step (4) of Embodiment 2 is the same as Step (4) in Embodiment 1.

Table 4 shows the measured peel strengths of the copper film and PI film after chemical copper deposition and plating thickening are conducted, which follow the plasma treatment of the polyimide thin film (PI film) for 10 seconds. The quality of the flexible board prepared by Embodiment 2 is comparable to that of Embodiment 1, while the manufacturing cost is further reduced.

TABLE 4

The peel strengths of copper films after the chemical copper deposition and the plating for thickening.

| | Thickness of copper film | | | | | | | | Thickness of PI film (μm) |
|---|---|---|---|---|---|---|---|---|---|
| | 5 | 10 | 15 | 20 | 25 | 30 | 40 | 50 | |
| Peel strength (N/cm) | 8.1 | 8.6 | 8.3 | 8.4 | 8.3 | 8.3 | 8.4 | 8.3 | 12.5 |
| | 8.8 | 8.3 | 8.2 | 8.2 | 8.4 | 8.5 | 8.3 | 8.4 | 20 |
| | 8.9 | 8.5 | 8.4 | 8.4 | 8.6 | 8.3 | 8.2 | 8.1 | 50 |

Embodiment 3

In the present embodiment, the plasma discharging gas in Step (2) is nitrogen gas bubbled through a palladium solution diluted by deionized water (palladium solution:deionized water≥1:7). The plasma discharge treatment is conducted for 10-30 seconds. Palladium solution is palladium sulfate solution with a palladium concentration of 4000 mg/L. The rest is the same as Embodiment 1.

Embodiment 4

In the present embodiment, the plasma discharging gas in Step (2) is nitrogen gas bubbled through a nickel chloride solution diluted by deionized water (nickel chloride:deionized water≥1:5). The plasma discharge treatment is conducted for 10-30 seconds. The rest is the same as Embodiment 1.

The above is merely preferred embodiments of the technical solutions of the present invention and is not used to limit the present invention application. Within the substantial contents of the present technical solutions, any alternations, equivalent replacements, and simple improvements etc., all fall within the protection scope of the present invention.

What is claimed is:

1. A method for preparing a polyimide adhesive-free flexible printed circuit board, comprising:
   1) placing a polyimide film into a vacuum environment, and treating the polyimide film using plasma produced by a capacitively coupled discharge of an organic amine;
   2) placing the polyimide film obtained in the step 1) into the vacuum environment, and pretreating the polyimide film using plasma formed by a capacitively coupled discharge of a nitrogen gas bubbled through a metal salt solution;
   3) pre-plating the polyimide film obtained in the step 2) using vacuum sputtering plating or chemical plating to obtain a dense copper film with a thickness of less than 100 nm; and
   4) thickening the copper film to a required thickness by means of an electroplating method.

2. The method for preparing the polyimide adhesive-free flexible printed circuit board according to claim 1, wherein
   a power density of the capacitively coupled discharge in the step 1) and the step 2) is >0.1 W/cm$^3$;
   an electric field intensity of a discharge region is >5.0 kV/m; and
   a pressure range of the capacitively coupled discharge is 30 Pa-80 Pa.

3. The method for preparing the polyimide adhesive-free flexible printed circuit board according to claim 2, wherein a plasma treatment time in the step 1) is 5-10 seconds.

4. The method for preparing the polyimide adhesive-free flexible printed circuit board according to claim 2, wherein a plasma treatment time in the step 2) is 10-30 seconds.

5. The method for preparing the polyimide adhesive-free flexible printed circuit board according to claim 2, wherein a pressure of the vacuum environment in the step 1) and the step 2) is less than or equal to 20 Pa.

6. The method for preparing the polyimide adhesive-free flexible printed circuit board according to claim 2, wherein the organic amine is fatty amine.

7. The method for preparing the polyimide adhesive-free flexible printed circuit board according to claim 2, wherein
   the metal salt is selected from the group consisting of copper salt, palladium salt, and nickel salt, and
   the metal salt is soluble in water.

8. The method for preparing the polyimide adhesive-free flexible printed circuit board according to claim 2, wherein the metal salt solution is a solution prepared with the metal salt and deionized water.

9. The method for preparing the polyimide adhesive-free flexible printed circuit board according to claim 2, wherein
   the metal salt solution is a solution prepared with copper sulfate and deionized water, where a mass ratio of the copper sulfate to the deionized water is more than 1:2.

10. The method for preparing the polyimide adhesive-free flexible printed circuit board according to claim 2, wherein
    the metal salt solution is a solution prepared with a palladium solution and deionized water, where a mass ratio of the palladium solution to deionized water is more than 1:7 and the palladium solution is a palladium sulfate solution with a concentration of 4000 mg/L.

11. The method for preparing the polyimide adhesive-free flexible printed circuit board according to claim 1, wherein a plasma treatment time in the step 1) is 5-10 seconds.

12. The method for preparing the polyimide adhesive-free flexible printed circuit board according to claim 1, wherein a plasma treatment time in the step 2) is 10-30 seconds.

13. The method for preparing the polyimide adhesive-free flexible printed circuit board according to claim 1, wherein a pressure of the vacuum environment in the step 1) and the step 2) is less than or equal to 20 Pa.

14. The method for preparing the polyimide adhesive-free flexible printed circuit board according to claim 1, wherein the organic amine is fatty amine.

15. The method for preparing the polyimide adhesive-free flexible printed circuit board according to claim 1, wherein
    the metal salt is selected from the group consisting of copper salt, palladium salt, and nickel salt, and
    the metal salt is soluble in water.

16. The method for preparing the polyimide adhesive-free flexible printed circuit board according to claim 1, wherein the metal salt solution is a solution prepared with the metal salt and deionized water.

17. The method for preparing the polyimide adhesive-free flexible printed circuit board according to claim 1, wherein
    the metal salt solution is a solution prepared with copper sulfate and deionized water where a mass ratio of the copper sulfate to the deionized water is more than 1:2.

18. The method for preparing the polyimide adhesive-free flexible printed circuit board according to claim 1, wherein in the step 3), when the copper film is pre-plated by chemical plating, a pH value of the chemical plating solution is 5-6.

19. The method for preparing the polyimide adhesive-free flexible printed circuit board according to claim 1, wherein
    the metal salt solution is a solution prepared with a palladium solution and deionized water, where a mass ratio of the palladium solution to deionized water is more than 1:7 and the palladium solution is a palladium sulfate solution with a concentration of 4000 mg/L.

20. The method for preparing the polyimide adhesive-free flexible printed circuit board according to claim 1, wherein
    the metal salt solution is a solution prepared with nickel chloride and deionized water, where a mass ratio of nickel chloride to deionized water is more than 1:5.

* * * * *